(12) United States Patent
Hamamura et al.

(10) Patent No.: US 9,157,972 B2
(45) Date of Patent: Oct. 13, 2015

(54) FAILSAFE PROTECTION FROM INDUCED RF CURRENT FOR MRI RF COIL ASSEMBLY HAVING TRANSMIT FUNCTIONALITY

(75) Inventors: Yoshinori Hamamura, Moreland Hills, OH (US); Xiaoyu Yang, Indiana, PA (US); Nicholas Castrilla, Ravenna, OH (US); Christopher J. Allen, Euclid, OH (US); Shinji Mitsui, Nasushiobara (JP)

(73) Assignees: QUALITY ELECTRODYNAMICS, LLC, Mayfield Village, OH (US); TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 195 days.

(21) Appl. No.: 13/586,122

(22) Filed: Aug. 15, 2012

(65) Prior Publication Data

US 2012/0306499 A1     Dec. 6, 2012

Related U.S. Application Data

(62) Division of application No. 12/791,166, filed on Jun. 1, 2010, now Pat. No. 8,269,499.

(51) Int. Cl.
*G01V 3/00* (2006.01)
*G01R 33/36* (2006.01)

(52) U.S. Cl.
CPC .......... *G01R 33/3642* (2013.01); *G01R 33/365* (2013.01); *G01R 33/3628* (2013.01)

(58) Field of Classification Search
CPC ............. G01R 33/3628; G01R 33/365; G01R 33/3642

USPC ................................................. 324/300–322
See application file for complete search history.

(56) References Cited

U.S. PATENT DOCUMENTS

| | | | |
|---|---|---|---|
| 4,620,155 A * | 10/1986 | Edelstein | 324/322 |
| 5,136,244 A | 8/1992 | Jones et al. | |
| 6,469,509 B2 * | 10/2002 | Friedrich et al. | 324/318 |
| 6,545,475 B2 * | 4/2003 | Kroeckel et al. | 324/318 |
| 2003/0146750 A1 | 8/2003 | Vaughan | |
| 2004/0174869 A1 | 9/2004 | Sone et al. | |
| 2006/0173285 A1 | 8/2006 | Mallozzi et al. | |
| 2006/0232275 A1 | 10/2006 | Leussler | |
| 2008/0186745 A1 | 8/2008 | Wennrich | |
| 2011/0291655 A1 | 12/2011 | Hamamura et al. | |

FOREIGN PATENT DOCUMENTS

| | | |
|---|---|---|
| JP | H11-056812 A | 3/1999 |
| JP | 2007-502138 A | 2/2007 |

OTHER PUBLICATIONS

L. Kyle Hedges, "A Fuse for Magnetic Resonance Imaging Probes," *Mag Res Med*, vol. 9, pp. 278-281 (1989).
Office Action issued Apr. 14, 2015 in JP Patent Application No. 2011-105583 with English translation.

* cited by examiner

*Primary Examiner* — Melissa Koval
*Assistant Examiner* — Daniel Miller
(74) *Attorney, Agent, or Firm* — Nixon & Vanderhye P.C.

(57) ABSTRACT

An electrically-controlled failsafe switch is included in an MRI transmit-and-receive RF coil assembly so as to protect it from induced RF currents in the event it is disconnected from an MRI system, but inadvertently left linked to strong MRI RF fields during imaging procedures using other RF coils.

20 Claims, 6 Drawing Sheets

FAILSAFE PROTECTION FROM INDUCED RF CURRENT FOR MRI RF COIL ASSEMBLY HAVING TRANSMIT FUNCTIONALITY

CROSS-REFERENCE TO RELATED APPLICATION

This application is a division of U.S. Ser. No. 12/791,166 filed Jun. 1, 2010, now U.S. Pat. No. 8,269,499, the entire content of which is incorporated herein by reference.

FIELD

The subject matter below relates generally to failsafe protection from induced radio frequency (RF) currents in magnetic resonance imaging (MRI) RF coil assembly components where the RF coil has RF transmitting functionality (e.g., a transmit/receive (T/R) RF coil assembly).

DETAILED DESCRIPTION

If an MRI RF T/R coil assembly (i.e., or a transmit-only coil assembly that has a local transmit function) is unplugged from connection to the MRI system (i.e., it is not currently being used), it may be mistakenly left in the MRI system gantry area where it is subject to intense MRI RF magnetic fields during imaging processes. If it does not have transmit decoupling means, large induced RF currents may be caused to flow within various components of the RF coil assembly. Typical removable RF receive-only coils already have built in protection (e.g., they are only active in the presence of weak RF fields emanating from the object being imaged).

However removable RF coils having transmit functionality (e.g., T/R coils) typically have not been equipped with suitable built-in automatic protection which leaves the coil assembly undamaged after an encounter with such induced RF current, makes the coil assembly safe for patients and others to be in contact with it throughout the encounter, and leaves the coil assembly ready for immediate continued use after the encounter (e.g., without the need to replace any component thereof such as a fuse). Large induced RF currents may damage the RF transmit or T/R coil assembly and/or endanger a patient or other person who comes into contact with the assembly since it may have a greatly raised surface temperature. For example, such large currents may excessively heat some of the components and may present a potential burn risk to any patient who is being imaged (e.g., by the use of other RF transmit coils at that moment—such as a large built-in fixed MRI system RF coil).

To provide failsafe protection to a transmit-only or a T/R MRI RF coil from such induced RF currents, several exemplary embodiments described below use a suitable variable impedance (e.g., an electrically-controlled switch) and respectively corresponding methods. In the exemplary embodiments, such variable impedance exhibits an impedance that changes between different impedance values in response to an electrical control current automatically provided when the RF coil is operatively connected to the MRI system. In such a "connected" state, the electrically-controlled impedance permits substantially unimpeded passage of MRI RF currents between the MRI system and a protected MRI RF T/R coil (i.e., in a connected-receive mode and in a connected-transmit mode). However, in a failsafe "unconnected" condition, a different impedance state of the variable impedance is configured to automatically substantially impede the passage of damaging induced RF currents within the RF T/R coil assembly. In effect, the switch exhibits three modes: two "connected" MRI operational modes and one fail-safe "unconnected" MRI non-operational mode.

Figure 1:
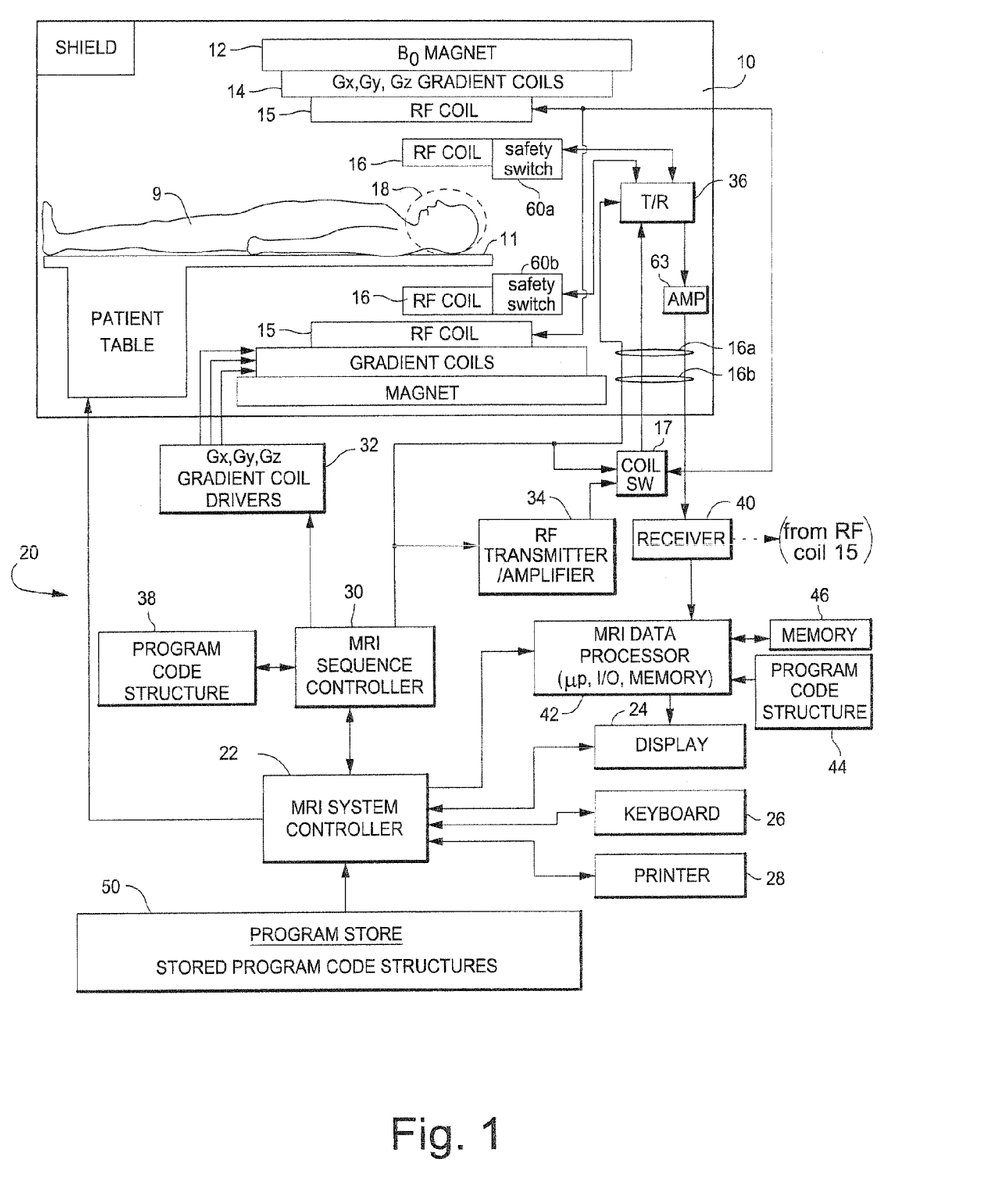
FIG. 1 illustrates an exemplary embodiment of an MRI system including failsafe protection from induced RF currents in an RF T/R coil assembly.

The exemplary MRI system embodiment shown in FIG. 1 includes a gantry 10 (shown in schematic cross-section) and various related system components 20 interfaced therewith. At least the gantry 10 is typically located in a shielded room. One exemplary MRI system geometry, depicted in FIG. 1, includes a substantially coaxial cylindrical arrangement of the static field B0 magnet 12, a $G_x$, $G_y$ and $G_z$ gradient coil set 14 and a built-in fixed RF coil assembly 15. Along the horizontal axis of this cylindrical array of elements is an imaging volume 18 shown as substantially encompassing the head of a patient 9 supported by a patient table 11.

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36. The MRI sequence controller 30 includes suitable program code structure 38 for implementing MRI sequences available in the repertoire of the MRI sequence controller 30.

The MRI system 20 includes an RF receiver 40 providing input to data processor 42 so as to create processed image data to display 24. In the exemplary embodiment, the receiver 40 is shown connected to pre-amplifier 63 associated with removable RF T/R coil assembly 16 via an interconnect interface 16a, 16b. However those in the art will appreciate that the receiver 40 may alternatively be connected with other RF coils, perhaps via other controlled RF switching circuitry not shown in FIG. 1 (e.g., a connection from the MRI system RF coil 15 is schematically depicted in dotted line in FIG. 1).

The MRI data processor 42 may also be configured for access to program code structure 44 and to memory 46 (e.g., for storing data derived from processing in accordance with the exemplary embodiments and the program code structure 44).

Also illustrated in FIG. 1 is a generalized depiction of an MRI system program store 50 where stored program code structures are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast ND conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an imaging process, an array of computer-readable accessible data value storage sites in physical storage media will be transformed from some prior state (e.g., all uniform "zero" values or all "one" values) to a new state, wherein the physical states at the physical sites of such an array vary between minimum and maximum values to represent real world physical events and conditions (e.g., the physical structures within an imaged volume space). As those in the art will appreciate, such arrays of stored data values represent and also constitute a physical structure—as does a particular structure of computer control program codes which, when sequentially loaded into instruction registers and executed by one or more CPUs of the MRI system 20, cause a particular sequence of operational states to occur and be transitioned through within the MRI system.

As depicted in the exemplary embodiment of FIG. 1, an RF coil assembly 16 is configured so that it may be removed (e.g., in favor of other removable RF coil assemblies and/or the more permanently installed RF coil assembly 15 for some imaging procedures—e.g., see coil switch 17 which may route transmitted RF to the fixed coil assembly 15 or to the removable coil assembly connector interface 16b) and manually disconnected from the MRI system via the manual mated plug/socket assembly interface 16a, 16b. In addition, an electrically-controlled failsafe safety switch 60a, 60b is included in the removable T/R RF coil assembly 16 (e.g., one for each of plural RF coil elements, if such are present).

In the exemplary embodiment of FIG. 1, the exemplary removable RF T/R coil assembly 16 may constitute, for example, a quadrature detection (QD) RF "head" coil comprising plural coil elements, each of which is configured to electromagnetically couple RF fields with an object being imaged (e.g., the patient's head) in the MRI system gantry 10. As will be understood, the failsafe protection provided by the exemplary embodiments is not limited to quadrature coils but may be otherwise utilized, e.g., by arrayed transmit and/or T/R coils.

Figure 2:
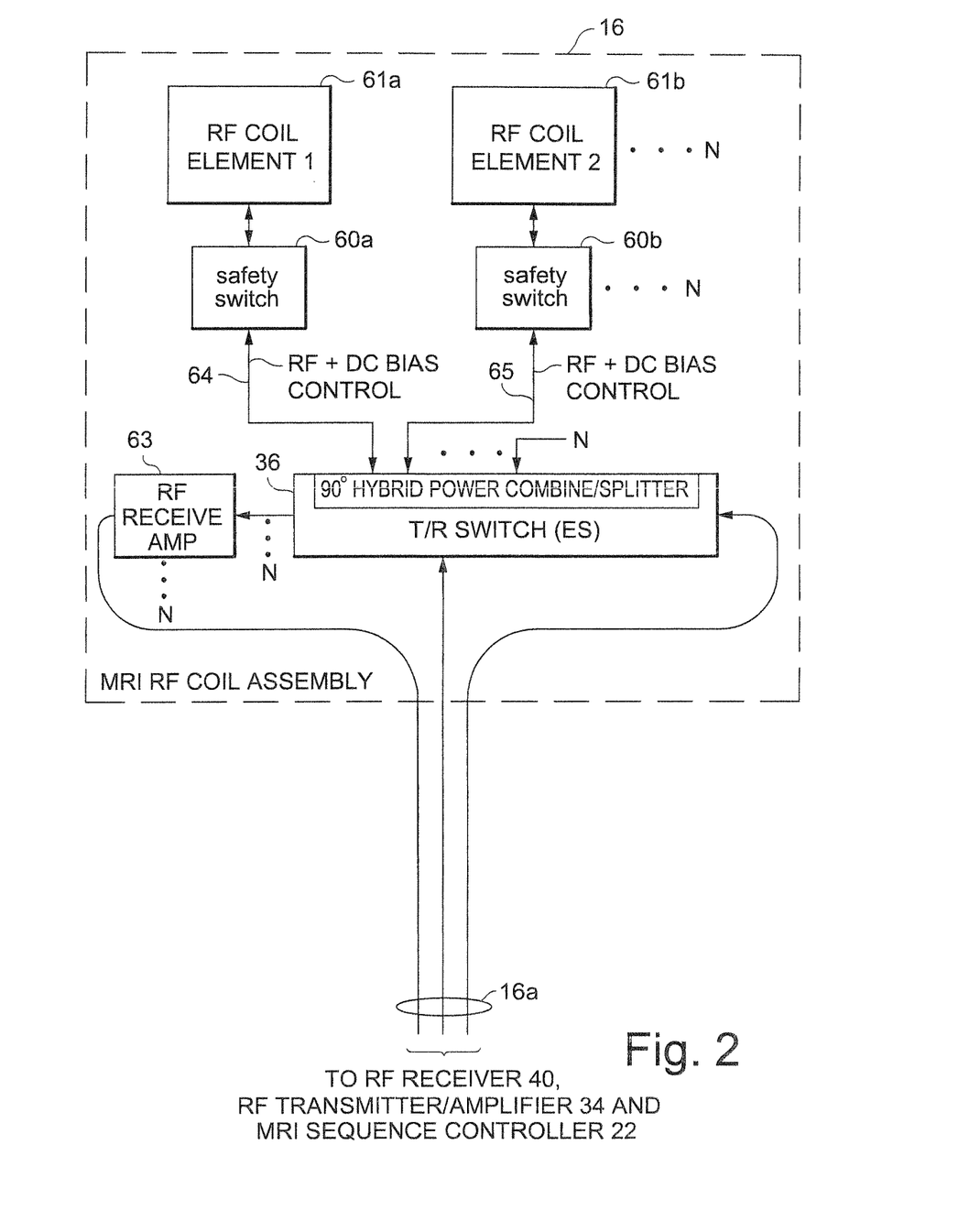
FIG. 2 is a schematic block diagram of an exemplary embodiment of an MRI RF T/R coil assembly of a type that might be used in the embodiment of FIG. 1.

A more detailed block diagram of an exemplary RF coil assembly 16 is depicted at FIG. 2. As those in the art will appreciate, a typical QD head coil will include two RF coil elements (e.g., 61a, 61b) which are spatially and electrically offset relative to one another by 90 degrees. Thus, FIG. 2 includes a schematic depiction of a 90 degree hybrid power combiner/splitter to effect an electrical RF phase shift between the two RF coil elements. As those in the art will appreciate, such hybrid power combiner/splitter may be located in the T/R switch (as schematically shown in FIG. 2) or elsewhere before or after the T/R switch (e.g., anywhere between the coil loop element and the power amplifier remotely located in the MRI system). As will also be appreciated, such phase shifting is not always required in all multi-coil element MRI RF coil assemblies.

In the exemplary embodiment, a failsafe safety switch (e.g., 60a, 60b) is serially connected with each RF coil element. That is, there is a separate serially connected safety switch respectively associated with each RF coil element in this exemplary embodiment. However, as those in the art will appreciate, other arrangements of a failsafe safety switch may be found effective in certain RF coil assembly configurations (e.g., the switch may be positioned at the feed point of an RF coil element, within the RF coil element or at some other suitable RF wavelength-related impedance-sensitive control position within the RF circuitry).

The transmit/receive (T/R) switch 36 (which may be remotely located as part of the MRI system) is controlled by sequence controller 22 to effectively connect appropriate RF transmitter/amplifier circuits 34 of the MRI system or RF receive circuits 40 of the MRI system to the different RF coil elements as appropriate for a particular data acquisition sequence—and, of course, a particular MRI RF coil assembly structure/configuration. Dedicated separate transmit and receive RF coils may also be used—in which case a T/R switch may not be needed. In the exemplary embodiment of FIG. 2, suitable RF receive buffer/preamplifier circuitry 63 is co-located within the RF coil assembly 16. Of course, there may be plural receive amplifiers to accommodate N plural receive channels—as is schematically depicted in FIG. 2. As also depicted in FIG. 2, the RF coil assembly 16 is suitable for manual connection to the MRI system via plug connector interface 16a (and a mating socket 16b associated with the MRI system).

In the exemplary embodiment of FIG. 2, the interface connection between the RF coil elements and the T/R switch is made via lengths of coaxial cable transmission line 64, 65 (e.g., possibly of 60 cm or so in length). Other interface connection circuitry may, of course, be employed instead of a "cable". Typically, such interface circuitry may include a transmission line circuit having a characteristic impedance of 50Ω In the exemplary embodiment of FIG. 2, the safety switches 60a, 60b are preferably located and connected closely to the coil element feed points with interconnecting transmission line lengths 64, 65 extending between the safety switches and the T/R switch 36. However, as will be appreciated, other appropriate functional locations for the safety switches may be employed.

As those in the art will appreciate, the MRI RF coil assembly 16 typically will be functionally and aesthetically disposed within a suitable housing so as to accommodate a particular patient body part (e.g., a head in this exemplary instance).

Since the construction of the RF coil elements, T/R switch, transmit amplifiers, receive amplifiers, MRI system, etc., can be of conventional design, no further details need be discussed for these elements. However, it should be noted that in the exemplary embodiment, if a DC bias circuit through relevant RF components does not already exist, it is now provided through connector 16a, 16b and various RF circuits as needed to pass DC bias current from the MRI system to the safety switch(es)—e.g., by using suitable low-pass frequency filtering elements (e.g., inductors) for passing DC bias currents and/or high-pass DC blocking capacitors to define the DC bias circuit.

In the exemplary embodiment of FIG. 2, the failsafe safety switches 60a, 60b include an electrically-controlled switch having at least one variable impedance component connected to an appropriate impedance-control point within or to the respectively corresponding RF coil element. The variable impedance component is configured to change its impedance to the passage of electrical currents between different impedance states in response to an electrical control signal (e.g., a DC bias control current) that is automatically provided from the MRI system whenever plug 16a is connected thereto. The DC bias current path may be provided in the RF circuitry comprising components 63, 34, 17, 36, 16a, 16b, 63, 64 and 65 that also conduct DC bias control currents to the failsafe safety switches 60a, 60b. In the failsafe mode (i.e., when the coil assembly 16 is not connected to the MRI system via plug 16a), no DC bias control current is available and the safety switches 60a, 60b then revert to an impedance state that effects substantial attenuation of induced RF currents to the coil elements if the coil assembly 16 happens to have been mistakenly left within the gantry area such that it is subjected to intense RF magnetic fields when the MRI system is activated (e.g., to image some different portion of the patient using some other RF coil assembly).

On the other hand, when the coil assembly 16 is connected to the MRI system via the manually actuated plug interface connector 16a, then a DC bias control current is supplied to the safety switches and this transitions the variable impedance component to a different impedance state that permits substantially unimpeded passage of MRI RF currents to and/or from the coil assembly 16 during imaging procedures using the coil assembly 16.

In connection with the FIG. 2 exemplary embodiment, it will be seen that RF coil element 61a, safety switch 60a and transmission line 64 constitute an MRI RF coil device sub-assembly that is (indirectly in this particular example) manually connected to an MRI system. The RF coil element 61a is configured to electromagnetically couple transmitted and received RF fields to/from an object (e.g., a patient's head) being imaged in an MRI system gantry. The electrically-controlled switch 60a has at least one variable impedance component connected to an appropriate impedance control point associated with RF coil element 61a, that variable impedance component being configured to change its impedance to the passage of electrical currents between a first impedance state and a second different impedance state in response to an electrical control current or signal (e.g., DC bias current) provided when the RF coil device is connected to the MRI system.

In the exemplary embodiment, an MRI RF T/R coil device sub-assembly also can be considered as including the transmit/receive switch 36 which, in this exemplary embodiment, is included as a part of a T/R coil assembly and configured to pass both RF and DC bias control currents from/to RF transmit/receive circuitry. As noted, such T/R switch may also be more remotely located in the MRI system in some embodiments.

The exemplary device sub-assembly typically may include the RF receive preamplifier circuit 63 as part thereof that is also manually connectable to RF receiver circuitry 40 in the MRI system (via the connection interface 16a, 16b). Typically the RF receive pre-amplifier 63 will be located relatively close to the RF coil elements.

As will be appreciated, in this exemplary system at least one of the transmit RF circuitry or the receive RF circuitry is configured to pass DC bias control current emanating from the MRI system (and passed concurrently with RF currents therealong through an auxiliary DC bias current path) and passing at least to the variable impedance component(s).

As those in the art will appreciate, and as represented by a series of dots leading to Nth elements in FIG. 2, there may be RF coil assemblies having a single RF in/out port, a pair of RF in/out ports, or more. In particular, some currently known RF coil assemblies utilize four separate RF in/out ports (e.g., for improved image uniformity, especially at higher static magnetic field levels).

Figure 3A:
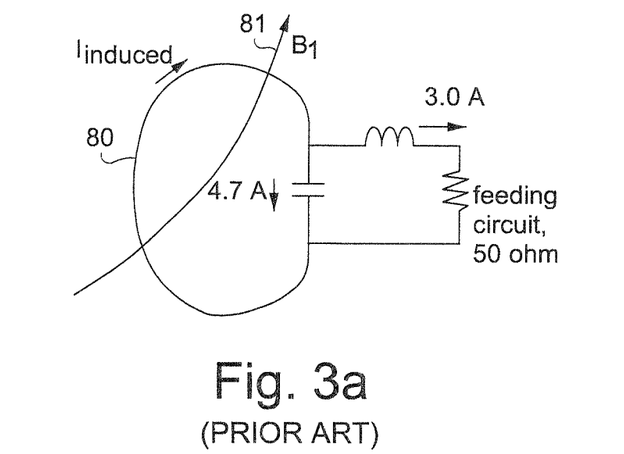
FIG. 3a depicts a schematic equivalent circuit of an RF T/R coil element and its feeding circuit as typically found in prior art installations subject to induced currents from ambient RF magnetic fields in the MRI system if left unconnected therein during activation of the MRI system RF transmitter.

FIG. 3a depicts a schematic equivalent circuit for a typical prior art circuit having an RF T/R coil element 80 that may be subjected to intense RF B1 magnetic field flux 81 linked to the coil element 80 if the coil is left unconnected within the MRI gantry during imaging procedures using other coils. As depicted in FIG. 3a, the feeding circuit (including interface transmission path 64, T/R switch 36, RF receive amp 63 and a suitable electrical interface circuit (e.g., another RF transmission path) to and through connector 16a shown in FIG. 2) can be considered as reduced to the equivalent LCR circuit shown in FIG. 3a. Although the exact current values flowing in any given installation may greatly vary, some simulated possible current magnitudes for induced currents are depicted in FIG. 3a. For example, perhaps 3 amps may be passed to the RF feeding circuits (and beyond), while perhaps 4.7 amps may flow in the coil element 80 itself. Since the coil element and capacitance are relatively low loss components, they may not heat up so much. However, as will be appreciated, such significant induced RF currents (especially over time) may substantially heat the more lossy (i.e., resistive) feeding circuit components and/or linked remote circuits which can more effectively absorb ambient RF electromagnetic energy. This may damage such components (perhaps so severely as to require replacement) and/or may provide rather extreme temperatures, thus creating a safety hazard for technicians and/or patients who may be in contact with or accidentally come into contact with such a misplaced RF coil assembly. For example, surface temperatures may reach more than 41° C. (even before a fuse is blown even if a fuse had been included in the prior art circuitry). Such extreme temperatures may cause patients, technicians and others coming into contact with such a misplaced coil assembly to be severely injured.

Figure 3B:
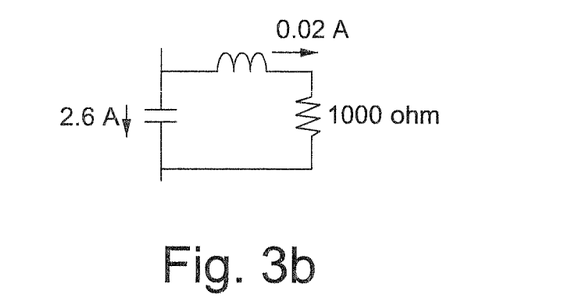
FIG. 3b depicts a schematic equivalent circuit for an RF T/R coil element subjected to such unintended induced RF currents, but now protected therefrom by an exemplary embodiment of a failsafe electrically-controlled switch.

FIG. 3b schematically depicts an equivalent circuit for an exemplary embodiment wherein the resistive impedance of the feeding circuitry (including any linked remote circuitry) has been greatly increased (e.g., from 50Ω to 1,000Ω). In this embodiment, under similar assumed simulation conditions as for FIG. 3a, it will be seen that the simulated exemplary induced currents are significantly reduced (within both the feeding circuit and any linked remote circuitry). The exemplary induced current within the RF coil element may be reduced approximately to the level of normal use while within the feeding circuit the induced current is much more greatly reduced so as to produce very little, if any, significant heating in the overall RF coil assembly.

Figure 4:
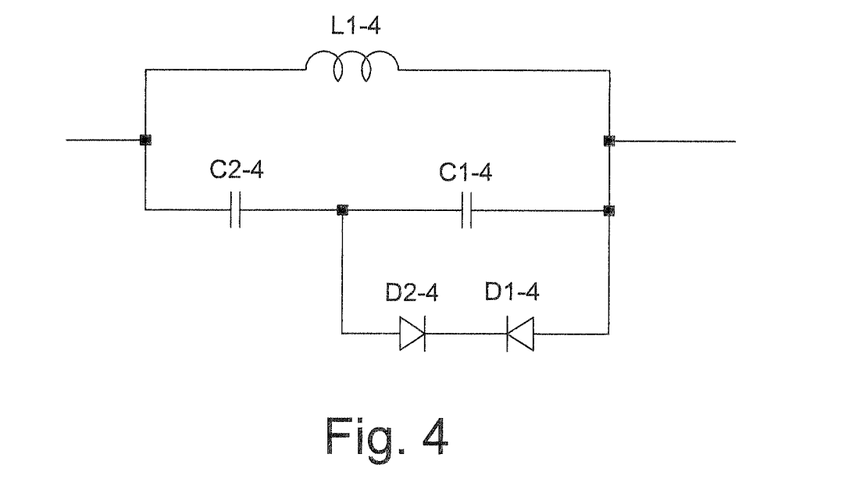
FIG. 4 is a schematic diagram of an exemplary electrically-controlled switch that can be used to provide failsafe protection from induced RF currents in an MRI RF T/R coil assembly.

A more detailed exemplary embodiment of an electrically-controlled switch suitable for use in this application is depicted in the schematic diagram of FIG. 4. In FIG. 4, the parallel LC circuit components comprising inductor L1-4 and capacitors C1-4 and C2-4 are dimensioned to provide parallel resonance (i.e., maximum impedance) at the expected RF operating frequency of the MRI system (e.g., approximately 63.86 megahertz in a 1.5 Tesla MRI system and approximately 127.73 megahertz in a 3 Tesla system). The pair of back-to-back connected diodes D1-4 and D2-4 are connected across at least a portion of the parallel LC circuit and configured to present a lowered RF impedance if both are forwardly biased (which detunes the LC circuit from resonance). The lowered non-resonant impedance thus permits intended MRI RF imaging currents to flow substantially unimpeded to the coil element. However, when not forwardly biased (e.g., when the RF coil assembly is not connected to the MRI system), the back-to-back connected diodes leave the LC circuit to present a substantial parallel resonance impedance that substantially obstructs the flow of induced RF currents in the event that the unconnected coil device nevertheless remains within an MRI system location where it can be exposed to MRI system RF transmit fields (e.g., from other RF coils that would otherwise induce dangerous RF currents in the coil element/feeding circuit components).

For the exemplary embodiments, the following Table 1 demonstrates an exemplary relationship between the three operational states of the RF coil assembly, the failsafe switch impedance state and the DC bias control voltage.

TABLE 1

| Operational State | Failsafe Switch Impedance | DC Bias Control Voltage |
|---|---|---|
| Unconnected: External RF exposure | High (OFF) | No voltage |
| Connected: Normal Tx RF | Low (ON) | High (ON) |
| Connected: Normal Receive RF | Low (ON) | High (ON) |

Figure 5:
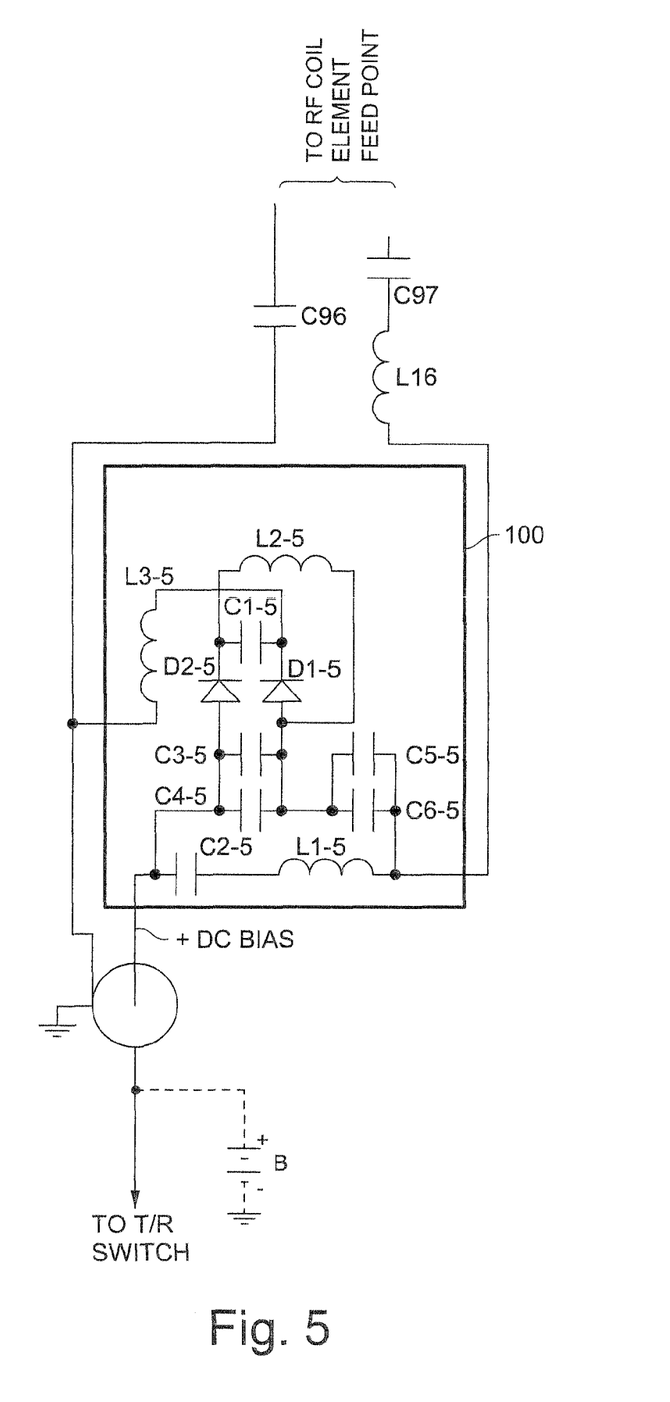
FIG. 5 is a more detailed schematic diagram of an embodiment similar to that shown in FIG. 4, but now including DC bias circuitry components.

The more detailed embodiment of FIG. 5 includes exemplary DC bias control current paths provided via the inductors L2-5, L3-5 and capacitor C1-5. As will be appreciated, the capacitor C1-5 is dimensioned so as to present a substantial short-circuit at the intended RF operating frequencies. In this embodiment, the parallel resonant LC circuit comprises the inductance L1-5 and the serial connected capacitor C2-5, as well as the serially connected pairs (of parallel connected) capacitors C3-5, C4-5, C5-5, C6-5. The DC bias current source (e.g., represented schematically by battery B) is located remotely as part of the MRI system and is thus shown with a dotted line connection in FIG. 5.

In the FIG. 5 embodiment, the failsafe switch 100 is preferably connected to its associated RF coil element feed point via inductor L16 (dimensioned suitably so as to provide impedance matching) and DC-blocking capacitors C96, C97. However, as will be described in more detail below, other suitable impedance control points in the RF coil element and/or its RF feed path may be chosen as the location for the failsafe switch 100.

In the FIG. 5 embodiment, the pair of back-to-back connected PIN diodes is connected across only part of the capacitance in the parallel resonant LC circuit so as to reduce the voltage across the PIN diodes—and thus help control maximum diode temperatures during the unplugged failsafe condition. However, the ratio of the split capacitance in the resonant LC circuit may also change the effective RF losses in the normal connected modes (which might be somewhat counteracted by using a relatively higher inductance value in the circuit if this can be achieved while still achieving desired impedance matching in the normal connected modes). Those in the art will recognize that dimensioning of the circuit values in all of the exemplary embodiments may well involve some design trade-offs and even trial and error to discover an optimum set of circuit component dimensions for a given particular RF coil assembly and the associated MRI system.

Figure 6:
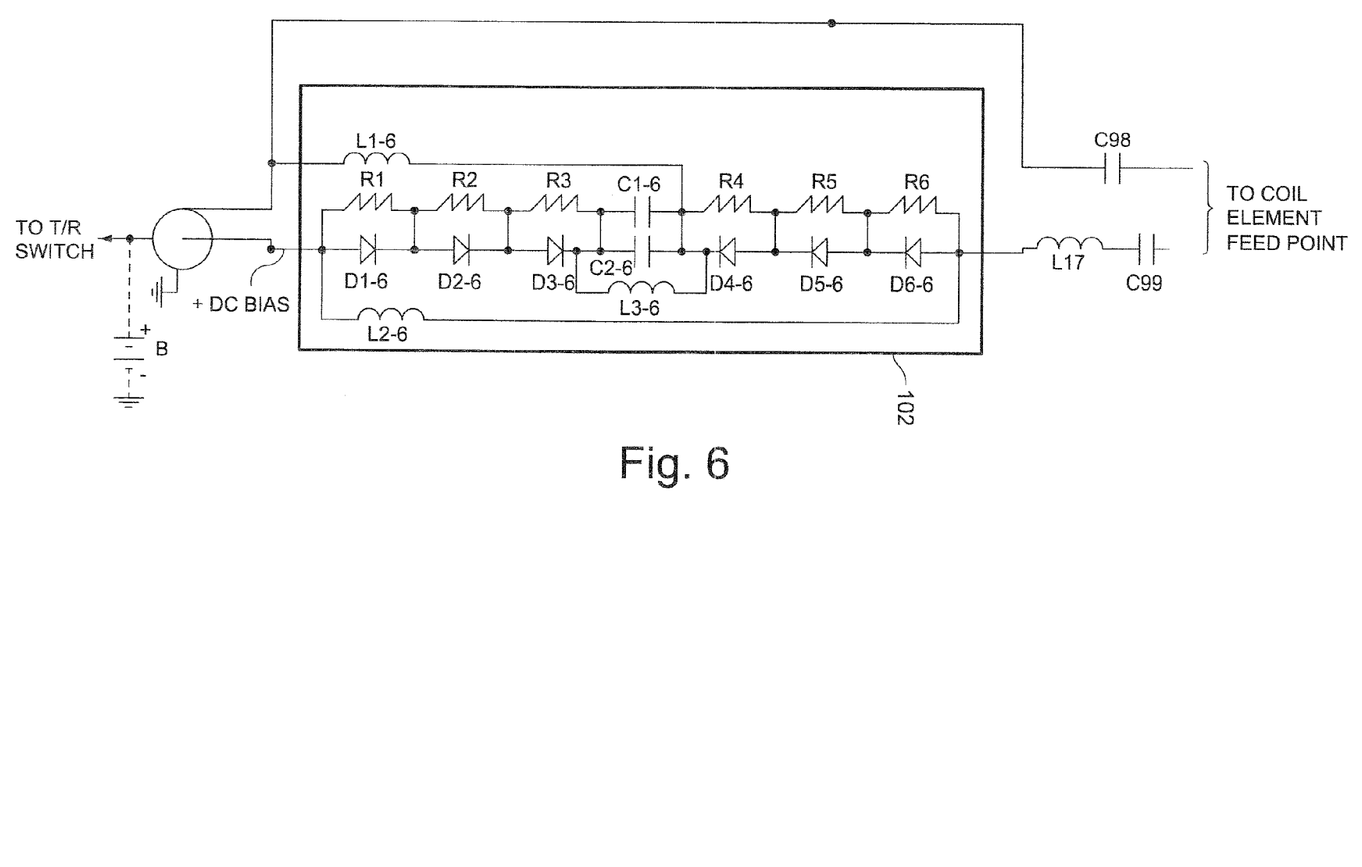
FIG. 6 is a schematic circuit diagram of another exemplary embodiment of an electrically-controlled switch that may be used to provide failsafe protection from induced RF currents in an MRI RF T/R coil assembly.

Another detailed embodiment is depicted schematically at FIG. 6 for a failsafe switch 102. Here, there is no parallel resonant LC circuit involved. Instead, there is simply a plurality of serially connected back-to-back diodes D1-6, D2-6, D3-6, D4-6, D5-6, D6-6). A suitable DC bias control circuit is provided by inductors L1-6, L2-6, L3-6 and capacitors C1-6, C2-6 (e.g., to conduct DC bias current from a source in the MRI system schematically represented in FIG. 6 as battery B connected in dotted line between an RF coaxial cable center conductor and system ground). If left un-connected to the MRI system (e.g., via the T/R switch and other RF circuitry if included as part of the RF coil assembly), these plural back-to-back unbiased diodes present a substantial impedance that substantially obstructs the flow of induced currents. However, if the switch 102 is connected to the MRI system, then DC bias control currents forwardly bias all of the diodes such that a lowered RF impedance is presented, thus permitting MRI RF imaging currents to flow substantially unimpeded to/from the respectively associated coil elements. Once again, an impedance matching inductance L17 is provided in the feed to the coil elements and, in this exemplary embodiment as well, DC blocking capacitances C98, C99 are employed.

Also present in the exemplary embodiment of FIG. 6 is a resistance connected in parallel across each diode. The resistances R1, R2, R3, R4, R5, R6 are of substantially equal resistance values (e.g., 4.4Ω) so as to establish substantially equal RF induced voltage drops across the diodes having the same orientation of polarity during the time they are simultaneously reverse-biased by induced RF current (i.e., when subjected to induced RF current and the forward bias control current is not present).

In the FIG. 6 embodiment, the use of more than one pair of back-to-back connected diodes helps distribute heat that is generated from the induced RF current flow.

In the exemplary embodiments, the diodes may be PIN diodes having relatively high reverse voltage breakdown characteristics (e.g., greater than 500 volts) and relatively small forward resistance. Typically, a bias current of approximately 150 milliamperes may suffice.

The exemplary embodiments can cause the effective quality factor (i.e., Q-factor) of the equivalent circuit (in its unconnected state) to be enhanced (e.g., possibly by 20-fold) so as to help ensure relatively small amounts of heat generation in the RF coil element itself. If possible, the effective high resistance state of the switch (e.g., when unconnected to the MRI system) should be approximately 1 kilohm or greater.

Some exemplary currently available suitable PIN diodes may be obtained from Macom Technology as diode part number MA4P7470F-1072T (having a reverse breakdown voltage of 800 volts) or MA4P7446F-1091 (having a reverse breakdown voltage of 600 volts). Whatever variable impedance element is used, the reverse breakdown voltage should be relatively high (e.g., preferably at least 500 volts if used in the context of a QD head coil).

The embodiment of FIG. 5 has an equivalent low impedance resistance of about 5Ω with typical component choices—while the embodiment of FIG. 6 for similar component choices may exhibit an equivalent low resistance of about 1.8Ω). Under some circumstances, it may be preferable to use the lower resistance embodiment—although proper design of either exemplary embodiment may achieve acceptable, perhaps almost equal, results.

Preferably, the electrically-controlled switch in the exemplary embodiments will effectively isolate the passage of the induced RF current link relatively close to the RF coil feeding points. That is, the exemplary electrically-controlled switches preferably may be located as close as feasible to the RF coil element feed points. As a result, relatively small amounts of induced RF energy will be transferred to the T/R switch and other more remote (i.e., more proximate the MRI system) RF circuitry components. At the same time, the heat generated by induced RF currents at the feed points is reduced as well.

Figure 7A:
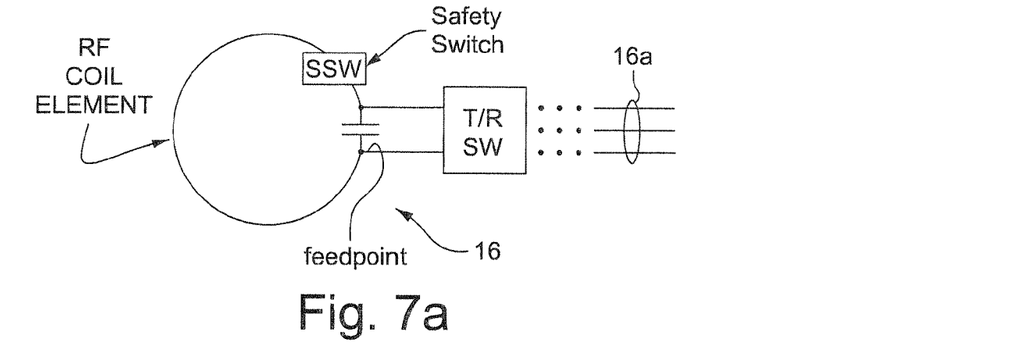
FIG. 7a, FIG. 7b and FIG. 8 depict alternate exemplary embodiments wherein a safety switch is located other than at the feed point of an RF T/R coil element.
Figure 7B:
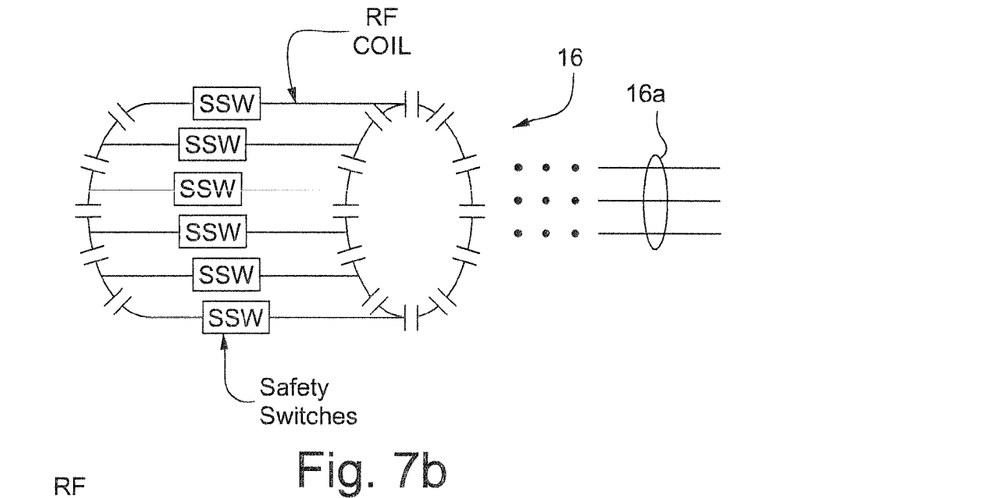
Figure 8:
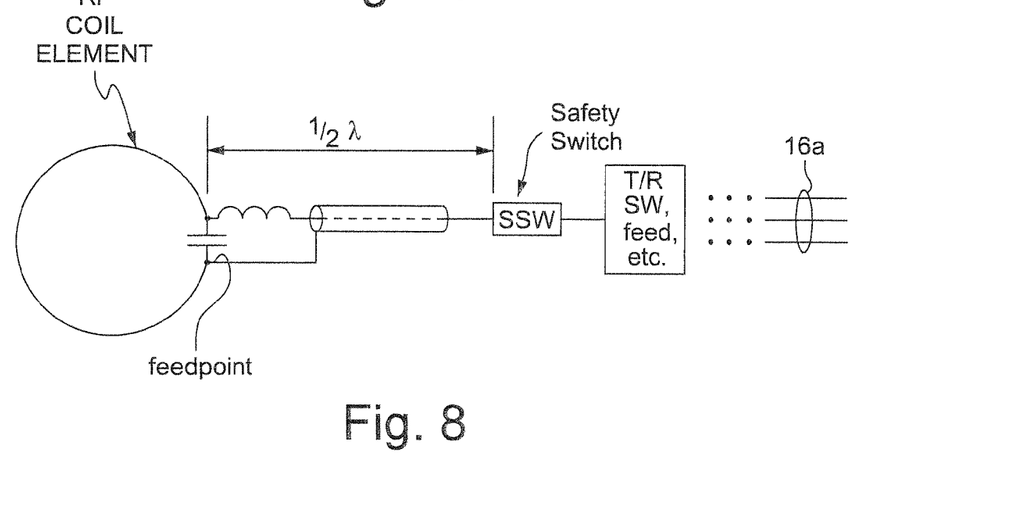

Although exemplary embodiments have been described with the safety switches preferably located at coil feeding points, a safety switch can alternatively be located in series in one or more of RF coil element loops as shown in FIG. 7a (single loop-type) and FIG. 7b (birdcage-type), or can be located at an electrically equivalent impedance-control position such as one-half wavelength (or an integer multiple thereof) away from the feed point as depicted in FIG. 8. Of course another suitable impedance point for a safety switch might be at one-quarter wavelength (or an odd integer multiple thereof) away from the feed point (in which case the variable impedance high-impedance and low-impedance states would be reversed for achieving comparable coil modes as compared to when the safety switch is located at one or more half-wavelengths from the feed point).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An RF coil assembly which is connectable to a Magnetic Resonance Imaging (MRI) system and has RF transmit capability, the RF coil assembly comprising:
   at least one RF coil circuit configured for removable connection to an MRI system; and
   a protection circuit electrically connected to said RF coil circuit and having at least one electrically variable impedance configured to automatically protect, when the RF coil assembly is in a state of being unconnected from the MRI system, the RF coil assembly from an RF magnetic field transmitted from another RF coil assembly,
   wherein the variable impedance comprises a parallel LC circuit and a pair of back-to-back connected diodes having an impedance controllable by a DC bias voltage supplied by the MRI system and applied to the diodes via the parallel LC circuit,
   wherein when the RF coil assembly is in a state of being unconnected from the MRI system and no DC bias voltage is applied to the diodes, the parallel LC circuit is resonant at an RF operating frequency of the MRI system to provide an impedance to substantially impede a flow of current induced in the at least one RF coil circuit by the RF magnetic field transmitted from the other RF coil assembly, and
   wherein when the RF coil assembly is in a state of being connected to the MRI system and the DC bias voltage is applied to the diodes, the parallel LC circuit is detuned at the RF operating frequency to provide a lowered non-resonant impedance to permit substantially unimpeded flow of RF imaging currents in the at least one RF coil circuit.

2. The RF coil assembly according to claim 1, wherein the protection circuit is configured to protect the RF coil assembly from an induced RF current generated by the RF magnetic field.

3. The RF coil assembly according to claim 1, wherein the RF coil assembly in the state of being unconnected is a transmit/receive (T/R) coil.

4. The RF coil assembly according to claim 1, wherein the another RF coil assembly is a built-in fixed RF coil assembly included in a gantry of the MRI system.

5. The RF coil assembly according to claim 3, wherein
   the RF coil assembly in the state of being unconnected includes a plurality of coil elements; and
   the protection circuit is electrically coupled to each of the plurality of coil elements.

6. The RF coil assembly according to claim 1, wherein the RF coil assembly in the state of being unconnected is configured to permit an RF current to flow within a coil element of said RF coil circuit when the RF coil assembly is in a state of being connected to the MRI system, and to reduce an RF current flow within the coil element when the RF coil assembly is in a state of being unconnected to the MRI system.

7. The RF coil assembly according to claim 6, wherein the MRI system includes a receive amplifier which amplifies an RF signal received by the coil element and the protection circuit is electrically coupled between the coil element and the receive amplifier.

8. The RF coil assembly according to claim 6, further comprising a phase shifter which shifts a phase of an RF signal received by the coil element and wherein said protection circuit is electrically coupled between the coil element and the phase shifter.

9. The RF coil assembly according to claim 5, further comprising a combiner which combines RF signals received by the coil elements and wherein said protection circuit is electrically coupled between the plurality of coil elements and said combiner.

10. The RF coil assembly according to claim 3, wherein the T/R switch switches a state of the T/R coil between transmitting and receiving and said protection circuit is electrically coupled between the coil element and said T/R switch.

11. The RF coil assembly according to claim 1, wherein
   the RF coil assembly in the state of being unconnected is a T/R coil; and
   the protection circuit is configured to enable, when the RF coil assembly is in a state of being connected to the MRI system, the RF coil assembly to transmit an RF magnetic field, and to protect, when the RF coil assembly is in the state of being unconnected from the MRI system, the RF coil assembly from the RF magnetic field transmitted from the another RF coil assembly.

12. An RF coil assembly which is connectable to a MRI system and has RF transmit capability, the RF coil assembly comprising:
   at least one RF coil circuit configured for removable connection to an MRI system; and a protection circuit electrically connected to said RF coil element and having at least one electrically variable impedance configured to automatically protect, when the RF coil assembly is in a state of being unconnected from the MRI system, the RF coil assembly from an RF magnetic field transmitted from another RF coil assembly, wherein the variable impedance comprises:
a first diode having a first resistance connected in parallel therewith;
a second diode having a second resistance connected in parallel therewith, wherein the first diode is connected back-to-back with the second diode, wherein the first and second diodes have a collective impedance controllable by a DC bias voltage applied to diodes by the MRI system, wherein when the RF coil assembly is in a state of being unconnected from the MRI system and no DC bias voltage is applied to the diodes, the collective impedance is increased to substantially impede a flow of current induced in the at least one RF coil circuit by the RF magnetic field transmitted from the other RF coil assembly, and wherein when the RF coil assembly is in a state of being connected to the MRI system and the DC bias voltage is applied to the diodes, the collective impedance is decreased to permit substantially unimpeded flow of RF imaging currents in the at least one RF coil circuit.

13. The RF coil assembly according to claim 12, wherein the protection circuit is configured to protect the RF coil assembly from an induced RF current generated by the RF magnetic field.

14. The RF coil assembly according to claim 12, wherein the RF coil assembly in the state of being unconnected is a transmit/receive (T/R) coil.

15. The RF coil assembly according to claim 14, wherein the T/R switch switches a state of the T/R coil between transmitting and receiving and said protection circuit is electrically coupled between the coil element and said T/R switch.

16. The RF coil assembly according to claim 12, wherein the another RF coil assembly is a built-in fixed RF coil assembly included in a gantry of the MRI system.

17. The RF coil assembly according to claim 12, wherein the RF coil assembly in the state of being unconnected is configured to permit an RF current to flow within a coil element of said RF coil circuit when the RF coil assembly is in a state of being connected to the MRI system, and to reduce an RF current flow within the coil element when the RF coil assembly is in a state of being unconnected to the MRI system.

18. The RF coil assembly according to claim 17, wherein the MRI system includes a receive amplifier which amplifies an RF signal received by the coil element and the protection circuit is electrically coupled between the coil element and the receive amplifier.

19. The RF coil assembly according to claim 17, further comprising a phase shifter which shifts a phase of an RF signal received by the coil element and wherein said protection circuit is electrically coupled between the coil element and the phase shifter.

20. The RF coil assembly according to claim 12, wherein
the RF coil assembly in the state of being unconnected is a T/R coil; and
the protection circuit is configured to enable, when the RF coil assembly is in a state of being connected to the MRI system, the RF coil assembly to transmit an RF magnetic field, and to protect, when the RF coil assembly is in the state of being unconnected from the MRI system, the RF coil assembly from the RF magnetic field transmitted from the another RF coil assembly.

* * * * *